(12) United States Patent
Staudinger et al.

(10) Patent No.: US 9,692,373 B2
(45) Date of Patent: *Jun. 27, 2017

(54) INVERSE CLASS F AMPLIFIERS WITH INTRINSIC CAPACITANCE COMPENSATION

(71) Applicant: FREESCALE SEMICONDUCTOR INC., Austin, TX (US)

(72) Inventors: Joseph Staudinger, Gilbert, AZ (US); Maruf Ahmed, Tempe, AZ (US); Hussain H. Ladhani, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/068,348

(22) Filed: Mar. 11, 2016

(65) Prior Publication Data

US 2016/0197589 A1    Jul. 7, 2016

Related U.S. Application Data

(63) Continuation of application No. 14/572,396, filed on Dec. 16, 2014, now Pat. No. 9,319,010.

(51) Int. Cl.
*H03F 3/191* (2006.01)
*H03F 3/217* (2006.01)
(Continued)

(52) U.S. Cl.
CPC ......... *H03F 3/2171* (2013.01); *H03F 1/0205* (2013.01); *H03F 1/086* (2013.01); *H03F 1/565* (2013.01); *H03F 3/193* (2013.01); *H03F 3/601* (2013.01); *H03F 2200/267* (2013.01); *H03F 2200/333* (2013.01); *H03F 2200/387* (2013.01); *H03F 2200/391* (2013.01); *H03F 2200/451* (2013.01)

(58) Field of Classification Search
CPC ....................................................... H03F 3/191
USPC .................................................. 330/302, 305
See application file for complete search history.

(56) References Cited

U.S. PATENT DOCUMENTS 5,159,287 A * 10/1992 Furutani ................. H03F 3/601
                                                                       330/286
6,104,259 A *  8/2000 Miyaura .............. H03H 7/0123
                                                                       330/286
(Continued)

*Primary Examiner* — Henry Choe

(57) ABSTRACT

The embodiments described herein provide inverse class F (class $F^{-1}$) amplifiers. In general, the inverse class F amplifiers are implemented with a transistor, an output inductance and a transmission line configured to approximate inverse class F voltage and current output waveforms by compensating the effects of the transistor's intrinsic output capacitance for some even harmonic signals while providing a low impedance for some odd harmonic signals. Specifically, the transistor is configured with the output inductance and transmission line to form a parallel LC circuit that resonates at the second harmonic frequency. The parallel LC circuit effectively creates high impedance for the second harmonic signals, thus blocking the capacitive reactance path to ground for those harmonic signals that the intrinsic output capacitance would otherwise provide. This facilitates the operation of the amplifier as an effective, high efficiency, inverse class F amplifier.

20 Claims, 5 Drawing Sheets

(51) Int. Cl.
*H03F 1/56* (2006.01)
*H03F 1/02* (2006.01)
*H03F 1/08* (2006.01)
*H03F 3/60* (2006.01)
*H03F 3/193* (2006.01)

(56) References Cited

U.S. PATENT DOCUMENTS

| | | | | |
|---|---|---|---|---|
| 6,236,274 | B1* | 5/2001 | Liu | H03F 3/217 |
| | | | | 330/302 |
| 6,384,688 | B1* | 5/2002 | Fujioka | H03F 3/193 |
| | | | | 330/302 |
| 6,731,174 | B2* | 5/2004 | Krvavac | H03F 3/193 |
| | | | | 330/302 |
| 7,868,698 | B2* | 1/2011 | Wilson | H03F 1/02 |
| | | | | 330/302 |
| 2007/0058308 | A1* | 3/2007 | Thijs | H03F 1/223 |
| | | | | 361/56 |
| 2007/0273449 | A1* | 11/2007 | Wilson | H03F 1/02 |
| | | | | 330/297 |
| 2011/0057726 | A1* | 3/2011 | Jos | H03F 3/2176 |
| | | | | 330/251 |
| 2013/0093475 | A1* | 4/2013 | Chang | H03B 19/14 |
| | | | | 327/118 |
| 2014/0225672 | A1* | 8/2014 | Wilson | H03H 7/38 |
| | | | | 330/277 |

\* cited by examiner

INVERSE CLASS F AMPLIFIERS WITH INTRINSIC CAPACITANCE COMPENSATION

CROSS REFERENCE TO RELATED APPLICATIONS

This application is a continuation of pending U.S. patent application Ser. No. 14/572,396, filed on Dec. 16, 2014.

TECHNICAL FIELD

The embodiments described herein relate generally to amplifiers and methods of their operation.

BACKGROUND

Amplifiers are used in a wide variety of applications. In general, Amplifiers are used to increase the power of signals. For example, amplifiers can be used to convert low-power radio frequency (RF) signals into larger RF signals for driving the antenna of a transmitter. In such cases, amplifiers may be implemented as part of overall RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

One method used to distinguish the type of amplifier is by "class". The amplifier class represents the amount of time the transistor is conducting current over one cycle when excited by a sinusoidal input signal. In general, classes such as A, B and C are conduction angle amplifiers defined by the length of their conductive state over one cycle when excited by a sinusoidal input signal. In these amplifiers the output stage is being driven to an intermediate level between being fully on and fully off. In contrast, classes such as D, E, are "switching" amplifiers that that are constantly switched between fully on and fully off. Other amplifiers, such as class F (and inverse class F) are conduction angle amplifiers where additional methods are employed to shape the transistor current and voltage waveforms to yield improvements in parameters such as amplifier output power and efficiency.

Specifically, class F and inverse class F amplifiers are amplifiers that can boost efficiency and output by shaping the output waveform into a near square wave with the use of harmonic resonators. So implemented, class F and inverse class F amplifiers can provide efficiencies of more than 90 percent in some applications. Such high efficiency amplifiers are increasingly desirable in radio frequency (RF) mobile communication applications. For example, high efficiency is increasing important in mobile phones, tablets, and other devices where long battery life is highly desirable. Unfortunately, implementing high efficiency class F and inverse class F amplifiers can be problematic. For example, the device output capacitance in many devices can prevent the effective and efficient implementation of high efficiency RF amplifiers for high power applications.

DETAILED DESCRIPTION

Figure 1:
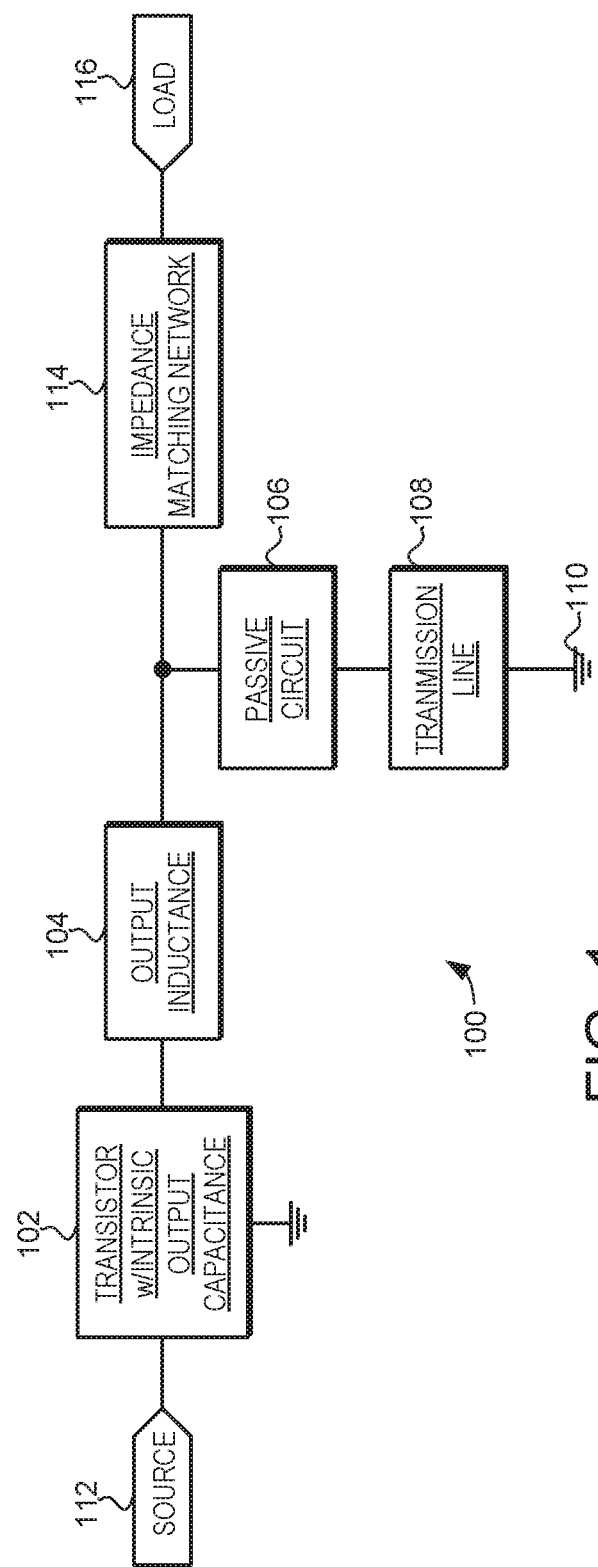
FIG. 1 is a schematic diagram of an inverse class F amplifier in accordance with an example embodiment.

The embodiments described herein provide inverse class F (class $F^{-1}$) amplifiers and methods of operation. So implemented, the inverse class F amplifiers can be used to provide high efficiency amplification for a variety of applications, including radio frequency (RF) applications. In general, the inverse class F amplifiers are implemented with a transistor, and an output inductance and transmission line configured to approximate inverse class F voltage and current output waveforms by compensating the effects of the transistor's intrinsic output capacitance for some even harmonic signals, while providing low impedance for some odd harmonic signals.

Specifically, the transistor is configured with the output inductance and transmission line to form a parallel inductor-capacitor (LC) circuit that resonates at twice a fundamental frequency ($2f_0$), where the fundamental frequency ($f_0$) is the operational frequency of the inverse class F amplifier, and twice the fundamental frequency ($2f_0$) is the second harmonic frequency. The parallel LC circuit effectively creates high impedance for the second harmonic signals, thus blocking the capacitive reactance path to ground for those harmonic signals that the intrinsic output capacitance would otherwise provide. This facilitates the operation of the amplifier as an effective, high efficiency, inverse class F amplifier.

In one embodiment, the inverse class F amplifier includes a transistor, an output inductance, and a transmission line. The transistor includes a transistor output and an intrinsic output capacitance coupled to the transistor output. The output inductance includes an output inductance first node and an output inductance second node, where the output inductance second node is coupled to the transistor output. The transmission line includes a first node and a second node, the transmission line first node coupled to the output inductance second node. In this embodiment the transmission line and output inductance are configured to form a parallel LC circuit with the intrinsic output capacitance for harmonic signals having about twice the fundamental frequency ($2f_0$). Furthermore, the parallel LC circuit is configured to resonate at about twice the fundamental frequency ($2f_0$) to create a high impedance at the transistor output and prevent the intrinsic output capacitance from providing a capacitive reactance to ground for harmonic signals at the about twice the fundamental frequency ($2f_0$). Furthermore, in some embodiments the transmission line also acts as an impedance transformer that presents a low impedance to the transistor for harmonic signals having about three times the fundamental frequency ($3f_0$). In other embodiments, the transistor's intrinsic output capacitance is used to present a low impedance for those harmonic signals having about three times the fundamental frequency ($3f_0$). As will be explained in greater detail below, the various embodiments can be implemented by selecting an appropriate length and termination node of the transmission line and an appropriate value for the output inductance.

Turning now to FIG. 1, an exemplary inverse class F amplifier 100 is illustrated schematically. In this embodiment the amplifier 100 includes a transistor 102, an output inductance 104, a passive circuit element 106 and a transmission line 108. For example, the transistor 102 may be a field effect transistor (FET), such as a gallium nitride (GaN) FET or a silicon or gallium arsenide (GaAs) FET. During operation, the amplifier 100 receives an input signal at a source 112, and outputs an amplified signal through the impedance matching network 114 and to the load 116. The signal has a fundamental frequency ($f_0$), and as such includes multiple harmonic signals, including a second harmonic of about twice the fundamental frequency ($2f_0$) and a third harmonic of about three times the fundamental frequency ($3f_0$).

Figure 2:
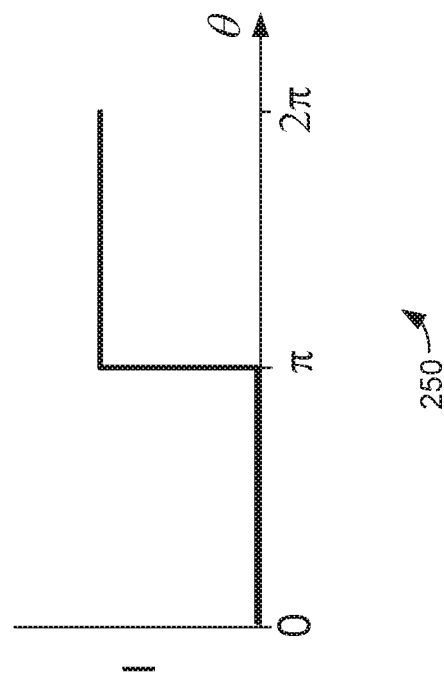
FIG. 2 is a graphical representation of a voltage waveform and current waveform in an exemplary inverse class F amplifier.
Figure 2:
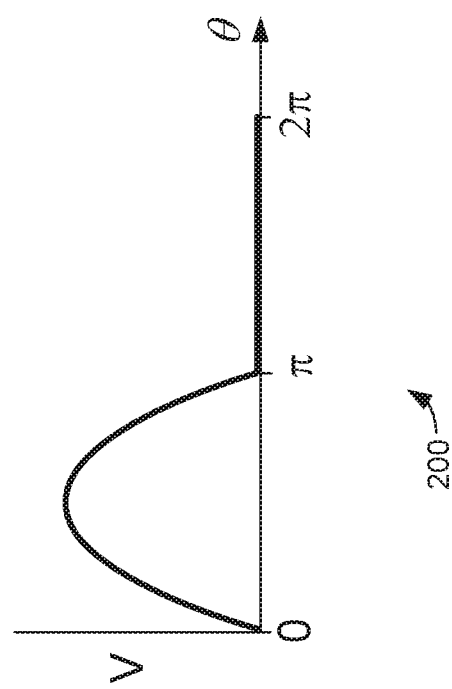

In general, the inverse class F amplifier 100 operates by generating defined, inverse class F output voltage and current waveforms. These waveforms minimize power consumption by reducing the portions of each cycle where current and voltage overlap. Turning to FIG. 2, a graph 200 illustrates an idealized output current and graph 250 illustrates an idealized output voltage for an inverse class F amplifier. As can be seen in FIG. 2, the output voltage is a half-sinusoid that is non-zero over the first half of the output cycle, and the output current is a square wave that is non-zero only over the second half of the output signal. When so implemented with substantially non-overlapping voltage and current output waveforms, a high efficiency, inverse class F amplifier can be provided.

The square wave current waveform illustrated in graph 200 can be approximated as:

$$I_S(\phi)=I_D+I_1 \cdot \sin(\phi)+I_3 \cdot \sin(3\phi)+I_5 \cdot \sin(5\phi)+I_7 \cdot \sin(7\phi)+ \ldots I_n \cdot \sin(n\phi)$$

Notably, this current waveform approximation uses only the odd harmonics. Likewise, the half-sinusoid voltage waveform illustrated in graph 250 can be approximated as:

$$V_{DS}(\phi)=V_{DD}-V_1 \cdot \sin(\phi)-V_2 \cdot \cos(2\phi)-V_4 \cdot \cos(4\phi)-V_6 \cdot \cos(6\phi)- \ldots V_m \cdot \cos(n\phi)$$

Notably, this voltage waveform approximation uses only the even harmonics. In each case, the equations represent suitable approximations of current and voltage that can provide inverse class F amplification. Thus, to effectively provide such an approximation, the impedance presented at the transistor, as referenced to the current source in the transistor, should exhibit high impedance to frequencies at the even harmonics and low impedance to frequencies at odd harmonics. In particular, providing a high impedance for signals at the second harmonic is of particular importance, with diminishing importance for higher order even harmonic frequencies. Likewise, providing a low impedance for signals at the third harmonic is of particular importance, with diminishing importance for higher order odd harmonic frequencies.

As noted above, the intrinsic output capacitance of typical transistors will typically allow a capacitive reactance path to ground for high frequency signals, including second harmonic frequency signals ($2f_0$). Such a capacitive reactance path would, if left uncompensated, provide a low impedance path to second harmonic frequencies, and thus would prevent efficient inverse class F operation. The embodiments described herein overcome this by providing a parallel LC circuit that resonates at the second harmonic frequency, thus providing a high impedance to the transistor at those frequencies. Furthermore, the various embodiments can further use the transmission line and/or the intrinsic output capacitance to provide that low impedance is presented to the transistor for odd harmonics, including third harmonic frequency signals ($3f_0$).

Returning to FIG. 1, the amplifier 100 can provide inverse class F operation by controlling the impedances to provide a high impedance at the second harmonic and low impedances at the odd harmonics. As such, the amplifier 100 can provide an approximation of inverse class F operation that can provide relatively high efficiency.

Specifically, the transistor 102 includes a transistor output and an intrinsic output capacitance coupled to the transistor output. The output inductance 104 includes an output inductance first node and an output inductance second node, where the output inductance second node is coupled to the transistor output. The passive circuit element 106 includes a passive element first node and a passive element second node, where the passive circuit element first node is coupled to the output inductance second node. The transmission line 108 includes a transmission line first node and transmission line second node. The transmission line first node is coupled to the passive circuit element second node and the transmission line second node is coupled to ground 110 (or another voltage reference).

In one embodiment, the output inductance 104 is implemented with a separate integrated or discrete device. For example, the output inductance 104 could be implemented with an integrated passive device (IPD). In another embodiment the output inductance 104 could be provided by a set of bonding wires or other connection to the transistor 102. For example, the output inductance 104 could be provided by bonding wires between a die containing the amplifier 100 and the impedance matching network 114. Finally, in some embodiments part of the output inductance 104 could be provided by the connection to the transistor 102, and part of the output inductance 104 could be implemented with the separate device.

In the embodiment of FIG. 1, the transmission line 108 has an effective length of about a quarter wavelength of the fundamental frequency. Stated another way, the effective length of the transmission line 108 is $\lambda/4$, where $\lambda$ is the wavelength of $f_0$ in the conductor. The effective length is sometimes referred to as the phase length, as it represents the length in the term of the phase shirt introduced by the conductor.

With a $\lambda/4$ effective length, the transmission line 108 operates as a quarter-wave impedance transformer coupled to the ground 110. The transmission line 108 will thus present a high impedance (e.g., open circuit) to the passive circuit element 106 second node for signals at about the fundamental frequency ($f_0$). Furthermore, the transmission line will present a low impedance (e.g., short circuit) to the ground 110 to the passive circuit element second node for second harmonic signals at about twice the fundamental frequency ($2f_0$) and other even harmonic signals (i.e., signals having a frequency of $nf_0$, where n is an even number). Furthermore, because transmission line 108 presents a short circuit to ground 110 for harmonic signals at $2f_0$, the output inductance 104 and the intrinsic output capacitance will operate as a parallel LC circuit at that frequency.

In this embodiment, the value for the output inductance 104 is selected to configure the parallel LC circuit to have a resonant frequency of about $2f_0$. So configured, the amplifier 100 will approximate the waveforms illustrated in FIG. 2 and can thus provide relatively high inverse class F operation. Specifically, the parallel LC circuit effectively creates a high impedance when resonating at $2f_0$, thus mitigating the capacitive reactance to ground the intrinsic output capacitance would otherwise provide. Furthermore, the arrangement presents a low impedance to the transistor 102 for third harmonic signals ($3f_0$) due to the transistor's intrinsic output capacitance. Finally, the transmission line 108 is configured to present high impedance to the passive circuit element second node at $f_0$. This negates the loading effects of the passive circuit element 106 at $f_0$, thus allowing the amplifier 100 to only see the impedance matching network 114 and load 116. Taken together this facilitates the operation of the amplifier 100 as an effective, high efficiency, inverse class F amplifier.

In general, the passive circuit element 106 provides low frequency blocking while presenting a low impedance at $2f_0$. In one embodiment, the passive circuit element 106 comprises a series LC circuit, the series LC circuit including an inductor in series with a capacitor. In this embodiment the series LC circuit is also configured to have a resonant frequency of about twice the fundamental frequency ($2f_0$). Series LC circuits provide a low impedance at their resonant frequency, and as such, the series LC circuit will present low impedance at $2f_0$. Additionally, the series LC circuit will provide low frequency blocking for signals near DC.

In another embodiment, the passive circuit element 106 comprises a capacitor. In this embodiment the capacitor is configured to have a relatively large capacitance, such that the capacitor provides DC blocking while presenting low impedance at $2f_0$.

Figure 3:
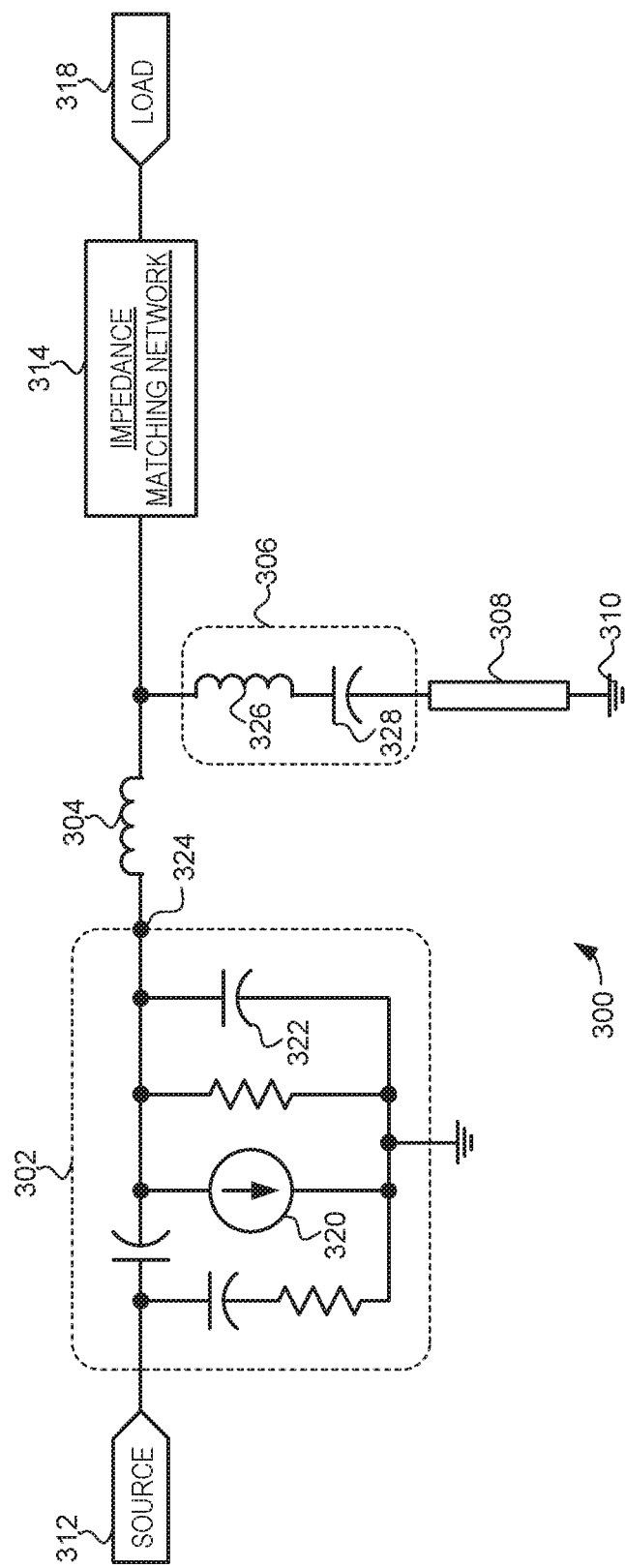
FIG. 3 is a schematic diagram of an inverse class F amplifier in accordance with an example embodiment.

Turning now to FIG. 3, an exemplary inverse class F amplifier 300 is illustrated schematically. In this embodiment the amplifier 300 includes a transistor 302, an output inductance 304, a passive circuit element 306 and a transmission line 308. During operation, the amplifier 300 receives an input signal at a source 312, and outputs an amplified signal through the impedance matching network 314 and to the load 318. The signal has a fundamental frequency ($f_0$), and as such includes multiple harmonic signals, including a second harmonic ($2f_0$) and third harmonic ($3f_0$).

In FIG. 3, the transistor 302 is modelled as a current source 320 and associated resistances and capacitances. A control terminal (e.g., a gate) of the transistor 302 is coupled to the source 312, a first current conducting terminal (e.g., a drain or source) is coupled to the inductance 304, and a second current conducting terminal (e.g., a source or drain) is coupled to ground (or another voltage reference). Included in the transistor model is an intrinsic output capacitance 322. In a typical field-effect transistor implementation, the intrinsic output capacitance 322 would be a drain-source capacitance commonly referred to as $C_{DS}$. In a typical bipolar transistor, the intrinsic output capacitance 322 would be a collector-emitter capacitance commonly referred to as $C_{CE}$. As was noted above, such an intrinsic output capacitance 322 would normally provide a capacitive reactance path to ground that would prevent efficient inverse class F operation. However, in the embodiments described herein, the intrinsic output capacitance 322 is selectively resonated as a parallel LC circuit with the output inductance 304 to block the path to ground for second harmonic signals.

In this embodiment, the passive circuit element 306 comprises a series LC circuit, the series LC circuit including an inductor 326 in series with a capacitor 328. The series LC circuit is configured to have a resonant frequency of about twice the fundamental frequency ($2f_0$), and as such will present a low impedance to second harmonic signals having a frequency of $2f_0$. For other signals the series LC circuit will provide relatively higher impedance. For example, the series LC circuit will provide DC blocking to prevent DC signals from flowing to ground 310. To facilitate this, the capacitor 328 can have a value between about 1 picofarad (pF) to about 20 pF when the fundamental frequency is in the range of about 1 GHz. The capacitor 328 can have higher or lower values, as well.

In this embodiment, the transmission line 308 has an effective length of about a quarter wavelength of the fundamental frequency ($f_0$). As such, the transmission line 308 operates as a quarter-wave impedance transformer. The transmission line 308 will thus present a high impedance (e.g., open circuit) to the passive circuit element 106 second node for signals at about the fundamental frequency ($f_0$) and present a low impedance (e.g., short circuit) to the ground 310 to the passive circuit element second node for harmonic signals at about twice the fundamental frequency ($2f_0$). Furthermore, because transmission line 308 presents a short circuit to ground 310 for harmonic signals at $2f_0$, the output inductance 304 and the intrinsic output capacitance 322 will operate as a parallel LC circuit at that frequency. Finally, the value for the output inductance 304 is selected to configure that parallel LC circuit to have a resonant frequency of about $2f_0$.

So configured, the inverse class F amplifier 300 can provide relatively high efficiency operation. Specifically, the parallel LC circuit resonates at $2f_0$ and effectively creates a high impedance at the transistor 302 output for those signals, thus mitigating the capacitive reactance to ground the intrinsic output capacitance 322 would otherwise provide. At $3f_0$ transmission line 308 presents a high impedance to the bottom the passive circuit element 306. Thus, at $3f_0$ the parallel LC circuit is not resonating, and the intrinsic output capacitance 322 provides a low impedance to those third harmonic signals. Stated another way, the parallel LC circuit creates a high impedance at the transistor output such that the intrinsic output capacitance is prevented from providing a capacitive reactance path to ground for the second harmonic signals ($2f_0$) while still providing the capacitive reactance path for third harmonic signals ($3f_0$).

Finally, the transmission line 308 is configured to present high impedance to the passive circuit element second node at $f_0$ and at odd multiples of $f_0$. This negates the loading effects of the passive circuit element 306 at $f_0$, thus allowing the amplifier 100 to only see the impedance matching network 314 and load 318. Taken together this facilitates the operation of the amplifier 300 as an effective, high efficiency, inverse class F amplifier.

Figure 4:
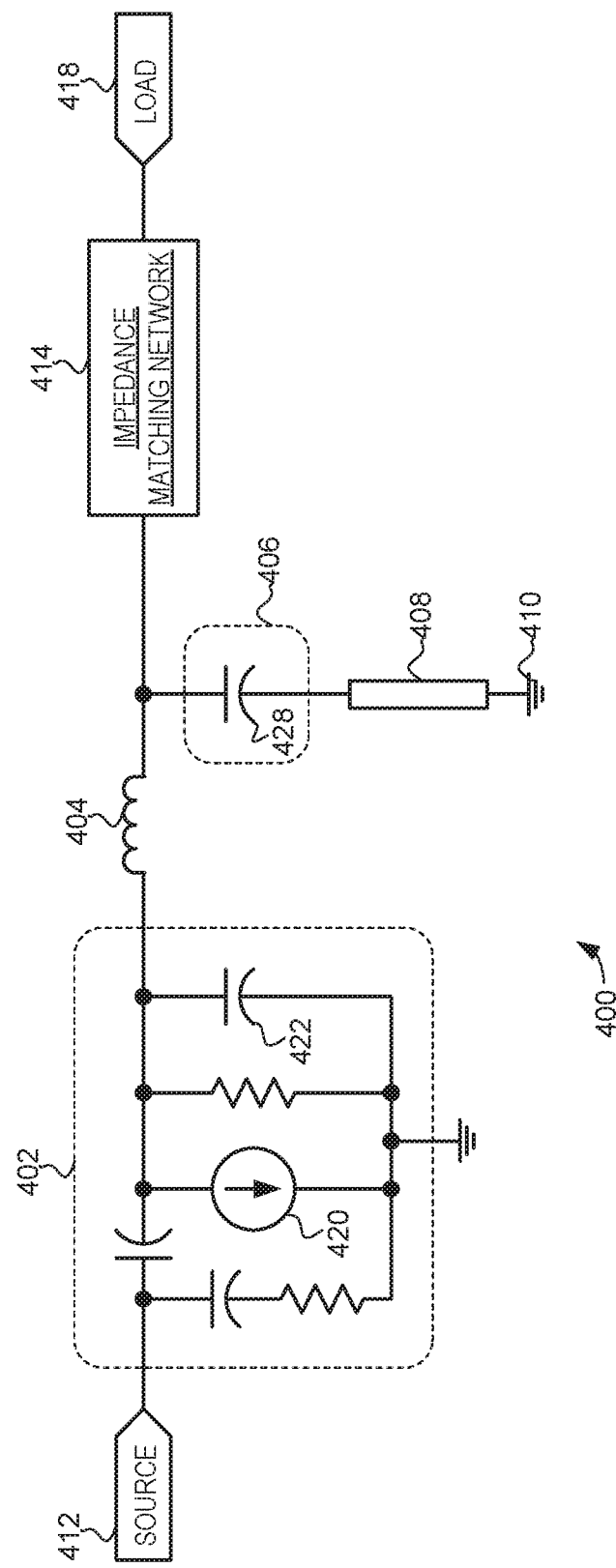
FIG. 4 is a schematic diagram of an inverse class F amplifier in accordance with another example embodiment.

Turning now to FIG. 4, another an exemplary inverse class F amplifier 400 is illustrated schematically. In general, this embodiment differs from that of FIG. 3 in that the passive element is a capacitor instead of a series LC circuit. In this embodiment the amplifier 400 includes a transistor 402, an output inductance 404, a passive circuit element 406 and a transmission line 408. During operation, the amplifier 400 receives an input signal at a source 412, and outputs an amplified signal through the impedance matching network 414 and to the load 418. The signal has a fundamental frequency ($f_0$), and as such includes multiple harmonic signals, including a second harmonic ($2f_0$) and third harmonic ($3f_0$).

The transistor 402 again is modelled as a current source 420 and associated resistances and capacitances, including an intrinsic output capacitance 422, such as a drain-source capacitance commonly referred to as $C_{DS}$. In accordance with the embodiments described herein, the intrinsic output capacitance 422 is selectively resonated as a parallel LC circuit with the output inductance 404 to block the path to ground caused by the intrinsic output capacitance 422 for second harmonic signals.

In this embodiment, the transmission line 408 has an effective length of about a quarter wavelength of the fundamental frequency ($f_O$). The transmission line 408 will thus present a high impedance (e.g., open circuit) to the passive circuit element 406 second node for signals at about the fundamental frequency ($f_O$) and present a low impedance (e.g., short circuit) to the ground 410 to the passive circuit element second node for harmonic signals at about twice the fundamental frequency ($2f_O$).

In this embodiment, the passive circuit element 406 comprises a single large capacitor 428. For example, the capacitor 428 can have a value between about 10 pF to 100 pF when the fundamental frequency is in the range of about 1 GHz, although the capacitance value could be higher or lower, as well. So implemented, the capacitor 428 provides DC blocking while presenting low impedance at $2f_O$. Furthermore, because the transmission line 408 again presents a short circuit to ground at $2f_O$, and because the capacitor provides a low impedance at $2f_O$, the intrinsic output capacitance 422 and output inductance 404 are again effectively in the form of a parallel LC circuit for second harmonic signals at $2f_O$. The value for the output inductance 404 is selected to configure that parallel LC circuit to have a resonant frequency of about $2f_O$. Thus, the parallel LC circuit again resonates at $2f_O$, and as such, the parallel LC circuit that exists at $2f_O$ will present high impedance to the transistor output in a way that mitigates the capacitive reactance to ground the intrinsic output capacitance 422 would otherwise provide.

So configured, the inverse class F amplifier 400 can provide relatively high efficiency operation. Specifically, the parallel LC circuit resonates at $2f_O$ and effectively creates a high impedance at the transistor 402 output for those signals, thus mitigating the capacitive reactance to ground the intrinsic output capacitance 422 would otherwise provide. At $3f_O$ transmission line 408 presents a high impedance to the bottom the passive circuit element 406. Thus, at $f_O$ the parallel LC circuit is not resonating, and the intrinsic output capacitance 422 provides a low impedance to those third harmonic signals. Stated another way, the parallel LC circuit creates a high impedance at the transistor output such that the intrinsic output capacitance 422 is prevented from providing a capacitive reactance path to ground for the second harmonic signals ($2f_O$) while still providing the capacitive reactance path for third harmonic signals ($3f_O$).

Finally, the transmission line 408 is configured to present high impedance to the passive circuit element second node at $f_O$. This negates the loading effects of the passive circuit element 406 at $f_O$, thus allowing the amplifier 400 to only see the impedance matching network 414 and load 418. Taken together this facilitates the operation of the amplifier 400 as an effective, high efficiency, inverse class F amplifier.

Figure 5:
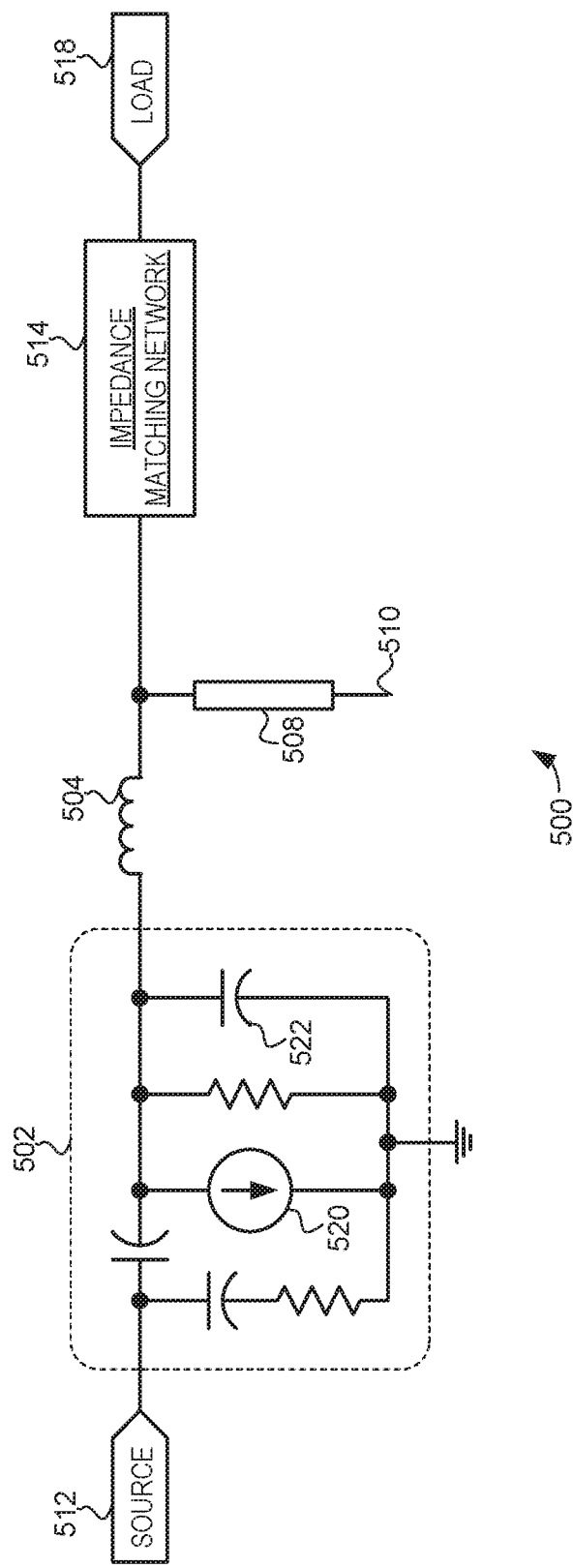
FIG. 5 is a schematic diagram of an inverse class F amplifier in accordance with another example embodiment.

Turning now to FIG. 5, another exemplary inverse class F amplifier 500 is illustrated schematically. In general, and in contrast to the embodiments of FIGS. 3 and 4, in this embodiment the transmission line has a different length and is connected to an open node rather than ground. Specifically, in this embodiment the transmission line effective length is quarter wavelength of the second harmonic rather than the fundamental frequency. Also, this embodiment does not include a passive circuit element coupled to the transmission line.

Specifically, in this embodiment the amplifier 500 includes a transistor 502, an output inductance 504, and a transmission line 508. During operation, the amplifier 500 receives an input signal at a source 512, and outputs an amplified signal through the impedance matching network 514 to the load 518. The signal has a fundamental frequency ($f_O$), and as such includes multiple harmonic signals, including a second harmonic ($2f_O$) and third harmonic ($3f_O$).

In FIG. 5, the transistor 502 is again modelled as a current source 520 and associated resistances and capacitances. Specifically, the transistor 502 again includes an intrinsic output capacitance 522, such as a drain-source-capacitance commonly referred to as $C_{DS}$.

In this embodiment, the transmission line first node is coupled to the output inductance 504, and the transmission line second node is coupled to an open node 510. Furthermore, in this embodiment, the transmission line 508 has an effective length of about a quarter wavelength of twice the fundamental frequency ($2f_O$). As such, the transmission line 508 will present a low impedance (e.g., short circuit) to the output inductance 504 for signals at about the second harmonic frequency ($2f_O$). Furthermore, the because transmission line 508 presents a short circuit for harmonic signals at $2f_O$, the output inductance 504 and the intrinsic output capacitance will operate as a parallel LC circuit at that frequency.

Furthermore, the output inductance 504 is selected to resonate with the intrinsic output capacitance 522 as a parallel LC circuit for signals at the second harmonic frequency ($2f_O$). So configured, the parallel LC circuit effectively creates a high impedance when resonating at $2f_O$, thus mitigating the capacitive reactance to ground the intrinsic output capacitance 522 would otherwise provide. Furthermore, because of the relatively shorter effective length of the transmission line 508, the transmission line 508 will appear as a capacitive element at the fundamental frequency ($f_O$) and as an inductive element at the third harmonic ($3f_O$). Thus, the transistor's intrinsic output capacitance 522 can still present low impedance to the transistor 502 for third harmonic signals ($3f_O$).

Stated another way, the parallel LC circuit operates to create a high impedance at the transistor output such that the intrinsic output capacitance 522 is prevented from providing a capacitive reactance path to ground for second harmonic signals while still providing the capacitive reactance path for third harmonic signals. The combination of a high impedance presented for signals at the second harmonic frequency ($2f_O$) combined with low impedance for signals at the third harmonic frequency ($3f_O$) combines to facilitate the operation of the amplifier 500 as an effective, high efficiency, inverse class F amplifier.

According to various embodiments, some or all of the above-described amplifier components are implemented within a packaged RF amplifier device. For example, a packaged RF amplifier device may include an input lead and an output lead. Referring to FIGS. 3-5, the transistor 302, 402, 502, inductance 304, 404, 504, passive circuit 306, 406, 506, transmission line 308, 408, 508, and at least a portion of the impedance matching network 314, 414, 514 may be included within the RF amplifier device package. The input lead may be coupled to the control terminal (e.g., gate) of the transistor 302, 402, 502 to receive the input signal, and the output lead may be coupled to the portion of the impedance matching network 314, 414, 514 that is implemented within the packaged RF amplifier device.

In one embodiment, a radio frequency (RF) amplifier configured to operate at a fundamental frequency ($f_O$) is provided, the RF amplifier comprising: a transistor including a transistor output and an intrinsic output capacitance coupled to the transistor output; an output inductance including a first node and a second node, the output inductance first node coupled to the transistor output; and a transmission line including a first node and a second node, the transmission line first node coupled to the output inductance second node, wherein the transmission line and output inductance are configured to form a parallel inductor-capacitor (LC) circuit with the intrinsic output capacitance for second harmonic signals at about twice the fundamental frequency ($2f_0$), and wherein the parallel LC circuit is configured to resonate for the second harmonic signals to create a high impedance at the transistor output to prevent the intrinsic output capacitance from providing a capacitive reactance path to ground for the second harmonic signals.

In another embodiment, an inverse class F amplifier configured to operate at a fundamental frequency ($f_0$) is provided, the inverse class F amplifier comprising: a transistor including a transistor output and an intrinsic output capacitance coupled to the transistor output; an output inductance including a first node and a second node, the output inductance first node coupled to the transistor output; a passive circuit element, the passive circuit element including a first node, and a second node, the passive element first node coupled to the output inductance second node; and a transmission line including a first node and a second node, the transmission line first node coupled to the passive circuit element second node, and the transmission line second node coupled to a voltage reference, wherein the transmission line has an effective length of about a quarter wavelength of the fundamental frequency ($f_0$) such that the transmission line presents a high impedance to the passive circuit element second node for signals at about the fundamental frequency ($f_0$) and presents a low impedance to the voltage reference to the passive circuit element second node for second harmonic signals at about twice the fundamental frequency ($2f_0$), and wherein the output inductance and the intrinsic output capacitance operate as a parallel inductor-capacitor (LC) circuit having a resonant frequency of about twice the fundamental frequency ($2f_0$) to create a high impedance at the transistor output such that the intrinsic output capacitance is prevented from providing a capacitive reactance path to ground for the second harmonic signals while still providing the capacitive reactance path for third harmonic signals at about three times the fundamental frequency ($3f_0$).

In another embodiment, an inverse class F amplifier configured to operate at a fundamental frequency (f0) is provided, the inverse class F amplifier comprising: a transistor including a transistor output and an intrinsic output capacitance coupled to the transistor output; an output inductance including a first node and a second node, the output inductance first node coupled to the transistor output; and a transmission line including a first node and a second node, the transmission line first node coupled to the output inductance second node, and the transmission line second node coupled to an open node, wherein the transmission line has an effective length of about a quarter wavelength of twice the fundamental frequency ($2f_0$), and wherein the output inductance and the intrinsic output capacitance operate as a parallel inductor-capacitor (LC) circuit having a resonant frequency of about twice the fundamental frequency ($2f_0$) to create a high impedance at the transistor output such that the intrinsic output capacitance is prevented from providing a capacitive reactance path to ground for second harmonic signals at about twice the fundamental frequency ($2f_0$) while still providing the capacitive reactance path for third harmonic signals at about three times the fundamental frequency ($3f_0$).

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A radio frequency (RF) amplifier configured to operate at a fundamental frequency ($f_0$), the RF amplifier comprising:
   a transistor including a transistor output and an intrinsic output capacitance coupled at the transistor output;
   an output inductance including a first node and a second node, the output inductance first node coupled to the transistor output; and
   a transmission line including a first node and a second node, the transmission line first node coupled to the output inductance second node, wherein the transmission line and output inductance are configured to form a parallel inductor-capacitor (LC) circuit with the intrinsic output capacitance for second harmonic signals at twice the fundamental frequency ($2f_0$), and wherein the parallel LC circuit is configured to resonate for the second harmonic signals to create a relatively high impedance at the transistor output to block a capacitive reactance path to ground through the intrinsic output capacitance for the second harmonic signals.

2. The RF amplifier of claim 1 further comprising a series LC circuit coupled between the transmission line first node and the output inductance second node, the series LC circuit including an inductor in series with a capacitor, the series LC circuit having a resonant frequency at twice the fundamental frequency ($2f_0$).

3. The RF amplifier of claim 1 further comprising a capacitor coupled between the transmission line first node and the output inductance second node.

4. The RF amplifier of claim 1 wherein the transmission line second node is coupled to a voltage reference, and wherein the transmission line has an effective length of a quarter wavelength of the fundamental frequency ($f_0$) such that the transmission line presents a high impedance for signals at the fundamental frequency ($f_0$) and presents a low impedance to the voltage reference for the second harmonic signals.

5. The RF amplifier of claim 1 wherein the transmission line second node is coupled to an open node, and wherein the transmission line has an effective length of a quarter wavelength of twice the fundamental frequency ($2f_0$) such that the transmission line presents a low impedance for the second harmonic signals.

6. The RF amplifier of claim 1 wherein the output inductance is provided at least in part by an integrated passive device.

7. The RF amplifier of claim 1 wherein the output inductance is provided at least in part by a bonding wire coupled to the transistor output.

8. A radio frequency (RF) amplifier configured to operate at a fundamental frequency ($f_0$), the RF amplifier comprising:
   a transistor including a transistor output and an intrinsic capacitance; and
   an output circuit coupled between the transistor output and the output lead, wherein the output circuit includes:
      an output inductance including a first node and a second node, the output inductance first node coupled to the transistor output; and
      a transmission line including a first node and a second node, the transmission line first node coupled to the output inductance second node, and the transmission line second node coupled to a voltage reference, wherein the transmission line presents a relatively high impedance to signals at the fundamental frequency, and presents a relatively low impedance to signals at twice the fundamental frequency ($2f_0$), and wherein the output inductance and the intrinsic capacitance are configured to form a parallel inductor-capacitor (LC) circuit for signals at twice the fundamental frequency ($2f_0$) and wherein the parallel LC circuit is configured to resonate for the signals at twice the fundamental frequency ($2f_0$).

9. The RF amplifier of claim 8 wherein the output circuit further comprises a series LC circuit coupled between the transmission line first node and the output inductance second node, the series LC circuit including an inductor in series with a capacitor, the series LC circuit having a resonant frequency at twice the fundamental frequency ($2f_0$).

10. The RF amplifier of claim 8 wherein the output circuit further comprises a capacitor coupled between the transmission line first node and the output inductance second node.

11. The RF amplifier of claim 8 wherein the transmission line second node is coupled to a voltage reference, and wherein the transmission line has an effective length of a quarter wavelength of the fundamental frequency ($f_0$) such that the transmission line presents a high impedance for signals at the fundamental frequency ($f_0$) and presents a low impedance to the voltage reference for the second harmonic signals.

12. The RF amplifier of claim 8 wherein the transmission line second node is coupled to an open node, and wherein the transmission line has an effective length of a quarter wavelength of twice the fundamental frequency ($2f_0$) such that the transmission line presents a low impedance for the second harmonic signals.

13. The RF amplifier of claim 8 wherein the output inductance is provided at least in part by an integrated passive device.

14. The RF amplifier of claim 8 wherein the output inductance is provided at least in part by a bonding wire coupled to the transistor output.

15. A packaged radio frequency (RF) amplifier device configured to operate at a fundamental frequency ($f_0$), the RF amplifier device comprising:
   an input lead;
   an output lead;
   a transistor including a control terminal coupled to the input lead, a transistor output, and an intrinsic capacitance; and
   an output circuit coupled between the transistor output and the output lead, wherein the output circuit includes:
      an output inductance including a first node and a second node, the output inductance first node coupled to the transistor output; and
      a transmission line including a first node and a second node, the transmission line first node coupled to the output inductance second node, and the transmission line second node coupled to a voltage reference, wherein the transmission line presents a relatively high impedance to signals at the fundamental frequency, and presents a relatively low impedance to signals at twice the fundamental frequency ($2f_0$), and wherein the output inductance and the intrinsic capacitance are configured to form a parallel inductor-capacitor (LC) circuit for signals at twice the fundamental frequency ($2f_0$) and wherein the parallel LC circuit is configured to resonate for the signals at twice the fundamental frequency ($2f_0$).

16. The packaged RF amplifier of claim 15 wherein the output circuit further comprises a series LC circuit coupled between the transmission line first node and the output inductance second node, the series LC circuit including an inductor in series with a capacitor, the series LC circuit having a resonant frequency at twice the fundamental frequency ($2f_0$).

17. The packaged RF amplifier of claim 15 wherein the output circuit further comprises a capacitor coupled between the transmission line first node and the output inductance second node.

18. The packaged RF amplifier of claim 15 wherein the transmission line second node is coupled to a voltage reference, and wherein the transmission line has an effective length of a quarter wavelength of the fundamental frequency ($f_0$) such that the transmission line presents a high impedance for signals at the fundamental frequency ($f_0$) and presents a low impedance to the voltage reference for the second harmonic signals.

19. The packaged RF amplifier of claim 15 wherein the transmission line second node is coupled to an open node, and wherein the transmission line has an effective length of a quarter wavelength of twice the fundamental frequency ($2f_0$) such that the transmission line presents a low impedance for the second harmonic signals.

20. The packaged RF amplifier of claim 15 wherein the output inductance is provided at least in part by an integrated passive device or a bonding wire coupled to the transistor output.

* * * * *